March 2, 1965 C. R. ESHELMAN ETAL 3,171,984
HIGH SPEED SWITCH UTILIZING TWO OPPOSITE CONDUCTIVITY TRANSISTORS AND CAPACITANCE
Filed Nov. 28, 1962
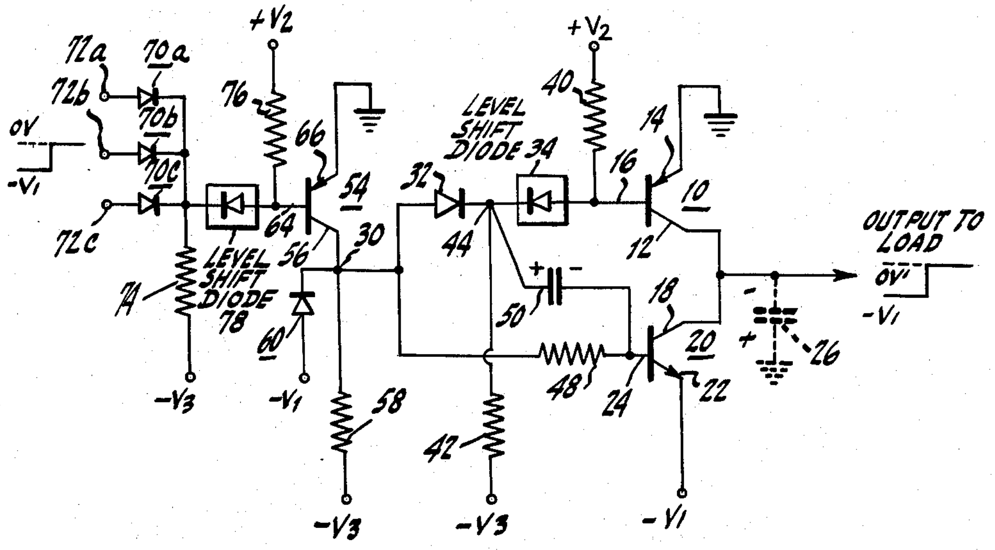
INVENTORS
CURTIS D. BRUDOS AND
CHARLES R. ESHELMAN
BY John V. Regan
Attorney

1

3,171,984

HIGH SPEED SWITCH UTILIZING TWO OPPOSITE CONDUCTIVITY TRANSISTORS AND CAPACITANCE

Charles R. Eshelman, Granada Hills, and Curtis D. Brudos, Sepulveda, Calif., assignors to Radio Corporation of America, a corporation of Delaware Filed Nov. 28, 1962, Ser. No. 240,615
8 Claims. (Cl. 307—88.5)

This invention relates to transistor switching circuits and, in particular, to an improved digital power amplifier.

It is desired that a digital power amplifier have either a first output level or a second output level, depending upon input conditions, and that the output level remain constant despite changes in output loading. Further, it is desired that there be a fast transition between the output levels in response to a change in input conditions. Most digital amplifiers of the prior art employ a single transistor operated as a large signal, nonlinear device in which the transistor is operated either in the saturated or in the cutoff condition.

One factor which affects the speed of transition between the output signal levels of such a single transistor amplifier is circuit capacitance, especially the capacitance in the output portion of the circuit. This capacitance may be stray capacitance and/or load capacitance. This capacitance may be rapidly charged (or discharged) through the low impedance collector-emitter path of the transistor when the transistor is saturated. However, when the transistor is turned off, the capacitance must discharge (charge) through the resistance in the output circuit. Since this resistance is relatively high in the ordinary circuit, the discharge time of the capacitance is much longer than the charge time. Thus, the capacitance has the effect of slowing the transition between output signal levels since the capacitance must be discharged or charged, as the case may be, before the output voltage reaches a steady value.

Furthermore, current often must be supplied to the output load when the transistor is in one operating state, and absorbed from the load when the transistor is in the other operating state. Current flowing between the amplifier and the load generally must flow through the collector supply resistor when the transistor is cut off, whereby changes in loading have the effect of changing the output voltage level.

It is one object of this invention to provide an improved transistor switching circuit which has a reduced switching time and a fast rise and fall time characteristic, that is, one in which the output voltage changes abruptly, relatively speaking, in response to a change in input.

It is another object of this invention to provide a digital amplifier which can supply current to a load in one condition and which can absorb current from the load in the other condition of the amplifier, without adversely affecting the wave-shape of the output signal.

It is another object of the invention to provide a transistor switching circuit in which the output capacitance may be charged and discharged rapidly without affecting the output signal waveform.

It is still another object of the invention to provide a high speed digital amplifying circuit which employs two transistors of opposite conductivity type, operated out of phase, and having their collector electrodes connected together and to a load, which circuit has means for assuring that the "on" transistor begins to turn off before the "off" transistor turns on in response to a change in input signal conditions.

2

In accordance with the invention, first and second transistors of opposite conductivity type are connected in the common emitter configuration and have their collector electrodes connected together and to an output load. The two emitter electrodes are connected to points of different operating potential. A level shifting means and a unidirectional conducting device are serially connected, in the order named, between the base electrode of the first transistor and an input terminal. The input terminal is connected to the base of the second transistor by means of a resistance element. Switch means connected at the input terminal selectively applies either a first or a second value of input voltage at the input terminal. The first transistor is biased into heavy conduction and the second transistor is biased in the nonconducting condition when the first value of input voltage is applied, and the operating conditions of the transistors are reversed when the second value of input voltage is applied. A capacitor connected between the base electrode of the second transistor and the junction of the unidirectional conducting device and level shifting means assures that the "on" transistor begins to turn off before the "off" transistor begins to turn on when the input voltage level is changed.

As will be described more fully hereinafter, one of the transistors supplies current to the load for one input signal condition and the other transistor can absorb current from the load for the other input signal condition. Since the two transistors operate substantially 180° out of phase, there is always present a low impedance path for charging and discharging any capacitance in the output circuit, whereby the output capacitance does not affect the rise or fall time of the output signal.

In the accompanying drawing, the sole figure is a schematic diagram of a high speed digital power amplifier according to the invention, and a transistor input circuit for selectively switching the input voltage of the amplifier.

The amplifying circuit includes a first transistor 10 of one conductivity type, illustrated as PNP, having collector 12, emitter 14 and base 16 electrodes. First transistor 10 is connected in the common emitter configuration by connecting the emitter electrode 14 directly to a source of reference potential, illustrated in the drawing by the conventional symbol for circuit ground. The collector electrode 12 is connected directly to the collector electrode 18 of a second transistor 20 of opposite conductivity type, illustrated as NPN. Second transistor 20 is connected in the common emitter configuration by connecting its emitter electrode 22 directly to a source of bias potential of $-V_1$ volts. This bias source, as well as other bias sources to be discussed, may be, for example, a battery (not shown). The output load on the circuit is connected to the collector electrodes 12 and 18. Capacitance in the output circuit is represented in the drawing by the capacitor 26 shown in dashed lines.

The input terminal 30 of the amplifier may be the output terminal of another transistor circuit to be described. An input coupling diode 32 and a nonlinear level shifting device 34 are serially connected, in the order named, between input terminal 30 and the base electrode 16 of first transistor 10. Input diode 32, which has its low resistance direction poled in opposition to the low resistance direction of the base 16-emitter 14 diode of the first transistor 10, may be, for example, a germanium diode. The level shifting device 34 preferably is a level shifting diode, for reasons to be described, and may be, for example, a "stabistor" diode poled in back-to-back relation with the input coupling diode 32. A level shifting diode may be defined as one having a closely controlled forward conducting threshold characteristic. Such diodes generally have capacitance which varies with the amount of current flowing through the diode and which is effective to provide fast turn off of the transistor to which it is connected.

A first resistor 40 is connected between the base electrode 16 and a source of positive potential, designated $+V_2$. This source has a polarity tending to reverse bias the emitter 14-base 16 diode. A second resistor 42 is connected between the junction 44, at the cathode of input diode 32, and a source of negative potential of $-V_3$ volts. The latter source has a polarity tending normally to forward bias the emitter 14-base 16 diode an amount sufficient to saturate first transistor 10.

A resistor 48 is connected between the input terminal 30 and the base electrode 24 of second transistor 20. This resistor 48 serves as a D.C. path for forward base current supplied to second transistor 20. A reactance element in the form of a capacitor 50 is connected between the base 24 of second transistor 20 and the junction 44. This capacitor furnishes an A.C. path for fast turn off of second transistor 20.

The transistor circuit having its output connected to the input terminal 30 may be considered a switch, operative to selectively apply a voltage of either zero volts or $-V_1$ volts at input terminal 30. This switch includes an input transistor 54 connected in the grounded emitter configuration and having its collector electrode 56 directly connected to the input terminal 30 of the digital amplifier circuit. A collector supply resistor 58 and a clamp diode 60 are connected from the terminal 30 to the $-V_3$ and $-V_1$ volt sources, respectively. Clamp diode 60 clamps the voltage at input terminal 30 at $-V_1$ volts when the input transistor 54 is biased in the nonconducting condition. The input circuitry at the base 64 of input transistor 54 is generally similar to the input circuitry of the first transistor 10 in the amplifying circuit, except that provision is made for supplying input signals from several sources through diodes 70*a*, 70*b*, 70*c*. An input signal may have a value of either zero volts or $-V_1$ volts.

The input transistor circuit shown performs the NOR function for positive input signals. That is to say, the values of the resistors 74, 76, the bias supplied $+V_2$, $-V_3$ and the conducting threshold of the level shift diode 78 are selected so that when the voltage applied at any of the terminals 72*a* . . . 72*c* is at zero volts, the associated one of the diodes 70*a* . . . 70*c* conducts and clamps the voltage at junction 82 at approximately ground potential. The base 64-emitter 66 diode then is reverse biased and input transistor 54 is nonconducting. The voltage at terminal 30 then is approximately $-V_1$ volts because of the action of the clamp diode 60. However, when all of the voltages applied at the terminals 72*a* . . . 72*c* are $-V_1$ volts, all of diodes 70*a* . . . 70*c* are reverse biased and the voltage at base electrode 64 is sufficiently negative with respect to ground to bias input transistor 54 into saturation. The voltage at terminal 30 then is approximately ground potential.

The input transistor 54 and its associated circuitry form no part of the present invention and are shown in the drawing only for the purpose of illustrating one form of a suitable switch for applying input levels of either zero volts or $-V_1$ volts selectively at the input terminal 30 of the amplifying circuit.

Consider now the operation of the amplifier. The values of the first and second resistors 40 and 42, the voltage sources $+V_2$ and $-V_3$, and the operating characteristic of the level shifting diode 34 in the amplifier are selected so that first transistor 10 is biased into heavy conduction, preferably saturation, when the input voltage is $-V_1$ volts. Input diode 32 is reverse biased and second transistor 20 is cut off at this time. The output voltage is approximately ground potential for this input condition, and first transistor 10 supplies current (in the conventional sense) to the output load. Moreover, the output voltage remains constant under changing load because of the low impedance of the collector 12-emitter 14 path. Furthermore, output capacitance 26 is discharged rapidly through the low impedance collector 12-emitter 14 path when first transistor 10 is turned on, whereby there is a fast transition between output voltage levels when the input is changed from zero volts to $-V_1$ volts.

When the input voltage is zero volts, second transistor 20 is biased into heavy conduction, preferably saturation. Input diode 32 becomes forward biased and clamps the voltage at junction 44 at a value slightly negative relative to ground potential. The additional voltage rise across level shift diode 34 is sufficient to cut off first transistor 10. The output voltage is approximately $-V_1$ volts for this input condition, and second transistor 20 can absorb current from the load. The output voltage remains steady under changing load because of the low impedance of the collector 18-emitter 22 path. Further, the output capacitance 26 is charged rapidly, in the polarity direction indicated, through the low impedance collector 18-emitter 22 path when second transistor 20 is turned on. Thus, there is a fast transition between output voltage levels when the input is switched from $-V_1$ volts to zero volts.

It will be noted that the collector-emitter paths of the first and second transistors 10 and 20 are connected in series between reference ground and the $-V_1$ volt source. It is necessary to insure that both transistors 10, 20 are not in the full "on" condition at the same time, or that one transistor is not on in saturation when the other transistor turns on; otherwise, the resulting heavy current may damage either or both of the transistors 10, 20.

When a transistor is driven into saturation and the driving signal then is removed or terminated, the transistor does not immediately turn off. Minority charge carriers are stored in the base region of a saturated transistor, and the transistor remains in a low impedance state until these charge carriers are removed. In the digital amplifier of the present invention, therefore, it is desired to remove the stored charge from the base region of first transistor 10 as rapidly as possible when the input voltage at terminal 30 goes from $-V_1$ to zero volts. In any event, first transistor 10 must at least start to turn off before second transistor 20 begins to turn on. For like reasons, when the input goes from zero volts to $-V_1$ volts, sufficient charge must be removed from the base region of second transistor 20 so that second transistor 20 at least starts to turn off before first transistor 10 begins to turn on. The manner in which these objectives are accomplished in the amplifier of the invention will now be described.

Assume that input transistor 54 is on in saturation, that is to say, the voltage at the input terminal 30 is zero volts. Coupling diode 32 is forward biased, first transistor 10 is cut off, and second transistor 20 is biased on in saturation. For the typical component values given hereinafter, the capacitor 50 is charged to about 3.2 volts in the polarity direction indicated.

Assume now that input transistor 54 turns off. The voltage at input terminal 30 falls toward $-V_1$ volts and coupling diode 32 becomes reverse biased. The voltage at junction 44 falls in a negative direction when diode 32 cuts off, there being insufficient current through level shift diode 34 at this time to sustain the voltage at junction 44 since first transistor 10 has not yet turned on. This negative drop in voltage is coupled to the base electrode 24 of the second transistor 20 by capacitor 50, causing reverse base current to flow and thereby removing the stored charge carriers from the base region and partially discharging capacitor 50.

The main current path for removing the stored charge carriers and discharging capacitor 50 comprises the low impedance emitter 22-base 24 diode, capacitor 50, resistor 42 and the bias sources $-V_3$ and $-V_1$. Resistor 42 is selected to have a relatively low value so that the charge carriers are removed at a high rate (short RC time constant). In any event, most of this charge is removed before the first transistor 10 begins to turn on. A small amount of charge flows through the higher impedance D.C. path comprising base resistor 48 and the collector resistor 58 of input transistor 54. After the charge is removed from the base region, the emitter 22-base 24 diode becomes a high resistance path, second transistor 20 cuts off, and the voltage at base electrode 24 is approximately $-V_1$ volts. In the steady state condition of the circuit for the input voltage $-V_1$ at terminal 30, the capacitor 50 is charged to approximately 2.0 volts, in the direction indicated, when the components have the values listed hereinafter.

The capacitor 50 should be large enough to remove all of the stored charge from the base of the second transistor 20 in the worst case. The value of capacitor 50 is computed from the following equation:

$$C \geqq \frac{q}{\Delta V}$$

where $q$ is the stored base charge in second transistor 20, and $\Delta V$ is the change in voltage at junction 44 when the input voltage changes from zero volts to $-V_1$ volts. Actually, this computed value is slightly pessimistic since some charge is removed through base resistor 48. However, this is offset by the fact that as charge is removed from the base region, the voltage at base electrode 24 goes more negative so that capacitor 50 is able to acquire less charge from the base 24 of transistor 20.

Capacitor 50 is connected to junction 44 rather than to the input terminal 30 for several reasons. First, it is undesirable to capacitively load the collector of the input transistor 54 since this slows down the voltage transition at input terminal 30. (There may be other circuits connected at this point.) Second, if capacitor 50 were connected at input terminal 30, the capacitor 50 would tend to discharge through base resistor 48 rather than through the emitter 22-base 24 diode. A larger capacitor would be required under these circumstances, and the increased capacitance would tend to further delay the voltage transition at the collector 56 of input transistor 54. Third, the value of resistor 42 is less than the value of collector resistor 58, whereby charge is removed faster from the base of second transistor 20. Fourth, the voltage drop across resistor 42 when capacitor 50 discharges is in a polarity direction tending to delay the turn on of first transistor 10.

Consider now the operation when the input voltage changes from $-V_1$ volts to zero volts. The emitter 14-base 16 diode of first transistor 10 is a low impedance path, and the emitter 22-base 24 diode is a relatively high impedance path prior to turn on of input transistor 54. Input diode 32 becomes forward biased when the input transistor 54 turns on and clamps the voltage at junction 44 slightly negative relative to ground potential. Because of level shifting diode 34, first transistor 10 starts to turn off almost immediately, the stored base charge thereof flowing through the low impedance path of level shift diode 34, input diode 32, and the low impedance collector 56-emitter 66 path of input transistor 54. Recall that the level shift diode has capacitance. The level shift diode 34 preferably is selected so that it has enough stored charge to neutralize the stored base charge of first transistor 10. The impedance of the base 24-emitter 22 diode of second transistor 20 remains relatively high until this transistor 20 has turned completely on, whereby first transistor 10 starts to turn off before second transistor 20 has turned on.

By way of example only, an amplifier according to the invention may have the following component values:

| | |
|---|---|
| Resistor **40** ohms | 3.9K |
| Resistor **42** do | 560 |
| Resistor **48** do | 620 |
| Capacitor **50** $\mu\mu$farads | 180 |
| Diode **32** | 1N3467 |
| Level shift diode **34** | IRC No. 69–5270 |
| Transistor **10** | 2N1204 |
| Transistor **20** | 2N2217 |
| $V_1$ volts | 4.5 |
| $V_2$ do | 12 |
| $V_3$ do | 16.5 |

The component values of the input transistor circuit may be as follows:

| | |
|---|---|
| Resistor **58** ohms | 1K |
| Resistor **74** do | 4.7K |
| Resistor **76** do | 51K |
| Diode **60** | 1N3467 |
| Level shift diode **78** | IRC No. 69–5270 |
| Diodes **70**a . . . **70**c | 1N3467 |
| Transistor **54** | 2N781 |

What is claimed is:

1. The combination comprising:

a first transistor of one conductivity type and a second transistor of opposite conductivity type, each connected in the common emitter configuration and having a base, an emitter and a collector electrode;

an output load;

means connecting the collector electrodes of the first and second transistors together and to said output load;

means connecting the emitter electrodes of said first and second transistors to points of different fixed operating potential;

an input terminal;

an input diode and a level shifting diode serially connected, in the order named, between said input terminal and the base electrode of said first transistor, said input diode having its low resistance direction poled in opposition to the low resistance direction of the base-emitter diode of said first transistor, said level shift diode being poled oppositely to said input diode;

a first resistor connected between the base electrode of said first transistor and a source of potential having a polarity tending to reverse bias said base-emitter diode of said first transistor;

a second resistor connected between the junction of said input diode and said level shift diode and a source of potential having a polarity tending to forward bias said base-emitter diode;

a resistor connected between the base electrode of said second transistor and said input terminal;

means for selectively switching the voltage at said input terminal between a first value and a second value, said first value of voltage having an amplitude and polarity to bias said first transistor into heavy conduction and to bias said second transistor in the nonconducting condition, said second value of voltage having an amplitude and polarity to bias said second transistor into heavy conduction and to bias said first transistor in the nonconducting condition;

and a capacitor connected between the base electrode of said second transistor and the junction of said input diode and said level shift diode, said capacitor having a value of capacitance $$\geqq \frac{Q}{\Delta V}$$

where Q is the stored base charge of said second transistor in the heavy conducting condition, and $\Delta V$ is the difference in voltage at the junction of said input diode and said level shift diode for the two different input voltage conditions.

2. The combination comprising:

a first transistor of one conductivity type having base, emitter and collector electrodes;

a second transistor of opposite conductivity type having base, emitter and collector electrodes;

means connecting the collector of said first transistor to the collector of said second transistor;

means connecting the emitter electrodes of said first transistor and said second transistor to a common point;

an input terminal;

an input diode and a nonlinear level shifting device connected in series, in the order named, between said input terminal and the base electrode of said first transistor, said input diode having its low resistance direction poled in opposition to the low resistance direction of the base-emitter junction of said first transistor;

first means connected to the junction of said input diode and said nonlinear level shifting device for normally biasing the base-emitter junction of said first transistor in the low resistance state;

second means connected to the base electrode of said first transistor tending to bias the base-emitter junction of said first transistor in the high resistance state;

a capacitor connected between one terminal of said level shifting device and the base electrode of said second transistor;

direct current conducting means connected between said input terminal and the base electrode of said second transistor;

and means for selectively shifting the voltage at said input terminal between a first value and a second value, said first value of voltage having an amplitude and polarity to bias said first transistor into heavy conduction and to bias said second transistor in the nonconducting condition, said second value of voltage having an amplitude and polarity to bias said second transistor into heavy conduction and to bias said transistor in the nonconducting condition.

3. The combination comprising:

a first transistor of one conductivity type having base, emitter and collector electrodes;

a second transistor of opposite conductivity type having base, emitter and collector electrodes;

means connecting the collector of said first transistor to the collector of said second transistor;

means connecting the emitter electrodes of said first transistor and said second transistor to a common point;

an input terminal;

an input diode and a nonlinear level shifting device connected in series, in the order named, between said input terminal and the base electrode of said first transistor;

a capacitor connected between one terminal of said level shifting device and the base electrode of said second transistor;

direct current conducting means connected between said input terminal and the base electrode of said second transistor;

and means for selectively shifting the voltage at said input terminal between a first value and a second value, said first value of voltage having an amplitude and polarity to bias said first transistor into heavy conduction and to bias said second transistor in the nonconducting condition, said second value of voltage having an amplitude and polarity to bias said second transistor into heavy conduction and to bias said transistor in the nonconducting condition.

4. A switching circuit comprising:

a first transistor of one conductivity type and a second transistor of opposite conductivity type, each having an input electrode, an output electrode and a control electrode;

means connecting the output and input electrodes of said first input transistor to the output and input electrodes, respectively, of said second transistor;

an input terminal;

a unidirectional conducting device and a level shifting means serially connected, in the order named, between said input terminal and said control electrode of said first transistor;

a resistance element connected between said input terminal and said control electrode of said second transistor;

an element having capacitance and being connected between said control electrode of said second transistor and the junction of said unidirectional conducting device and said level shifting means;

and means for selectively switching the voltage at said input terminal between a first value and a second value, the first value of voltage having an amplitude and polarity to bias said first transistor into heavy conduction and to bias said second transistor in a nonconducting condition, the second value of voltage having an amplitude and polarity to bias said second transistor into heavy conduction and to bias said first transistor in a nonconducting condition.

5. A switching circuit comprising:

a first transistor of one conductivity type and a second transistor of opposite conductivity type, each having an input electrode, an output electrode and a control electrode;

means connecting the output and input electrodes of said first input transistor to the output and input electrodes, respectively, of said second transistor;

an input terminal;

a unidirectional conducting device and a level shifting means serially connected, in the order named, between said input terminal and said control electrode of said first transistor;

a first resistor connected between the control electrode of said first transistor and a source of biasing potential having a polarity to bias said first transistor in a nonconducting condition;

a second resistor connected between the junction of said unidirectional conducting device and said level shifting means and a source of potential having a polarity to bias said first transistor in the conducting condition;

a resistance element connected between said input terminal and said control electrode of said second transistor;

a capacitor connected between said control electrode of said transistor and the junction of said unidirectional conducting device and said level shifting means;

and means for selectively switching the voltage at said input terminal between a first value and a second value, the first value of voltage having an amplitude and polarity to bias said first transistor into heavy conduction and to bias said second transistor in a nonconducting condition, the second value of voltage having an amplitude and polarity to bias said second transistor into heavy conduction and to bias said first transistor in a nonconducting condition.

6. A switching circuit comprising:

a first transistor of one conductivity type having base, emitter and collector electrodes;

a second transistor of opposite conductivity type having base, emitter and collector electrodes;

an output load;

means connecting the collector electrodes of said first and second transistors directly together and to said output load;

means connecting the emitter electrodes of said first and second transistors to points of different fixed operating potential;
an input terminal;
an input diode and a level shifting diode serially connected, in the order named, between said input terminal and the base electrode of said first transistor;
means including a source of voltage connected at the junction of said input diode and said level shifting diode for normally biasing the base-emitter junction of said first transistor in the low resistance state;
means including another source of voltage coupled to the base electrode of said first transistor for biasing the base-emitter junction of said first transistor toward the high resistance direction;
a resistor connected between said input terminal and the base electrode of said second transistor;
a capacitor connected between the base electrode of said second transistor and the junction of said input diode and said level shifting diode;
and means for switching the voltage at said input terminal between a first value and a second value, said first value of voltage biasing said first transistor into heavy conduction and biasing said second transistor in a nonconducting condition, and said second value of voltage biasing said second transistor into heavy conduction and biasing said first transistor in a nonconducting condition.

7. A switching circuit comprising:
a first transistor of one conductivity type having base, emitter and collector electrodes;
a second transistor of opposite conductivity type having base, emitter and collector electrodes;
an output load;
means connecting the collector electrodes of said first and second transistors directly together and to said output load;
means connecting the emitter electrodes of said first and second transistors to points of different fixed operating potential;
an input terminal;
an input diode and a level shifting diode serially connected, in the order named, between said input terminal and the base electrode of said first transistor;
a resistor connected between said input terminal and the base electrode of said second transistor;
a capacitor connected between the base electrode of said second transistor and the junction of said input diode and said level shifting diode;
and means for switching the voltage at said input terminal between a first value and a second value, said first value of voltage biasing said first transistor into heavy conduction and biasing said second transistor in a nonconducting condition, and said second value of voltage biasing said second transistor into heavy conduction and biasing said first transistor in a non-conducting condition.

8. A switching circuit comprising:
a first transistor of one conductivity type having base, emitter and collector electrodes;
a second transistor of opposite conductivity type having base, emitter and collector electrodes;
an output load;
means connecting the collector electrodes of said first and second transistors directly together and to said output load;
means connecting the emitter electrodes of said first and second transistors to points of different fixed operating potential;
an input terminal;
a diode and level shifting means serially connected, in the order named, between said input terminal and the base electrode of said first transistor;
a resistor connected between said input terminal and the base electrode of said second transistor;
a capacitor connected between the base electrode of said second transistor and the junction of said diode and said level shifting means;
and means for switching the voltage at said input terminal between a first value and a second value, said first value of voltage biasing said first transistor into heavy conduction and biasing said second transistor in a nonconducting condition, and said second value of voltage biasing said second transistor into heavy conduction and biasing said first transistor in a non-conducting condition.

No references cited.